United States Patent [19]

Orbach et al.

[11] Patent Number: 5,428,639
[45] Date of Patent: Jun. 27, 1995

[54] TWO'S COMPLEMENT PULSE WIDTH MODULATOR AND METHOD FOR PULSE WIDTH MODULATING A TWO'S COMPLEMENT NUMBER

[75] Inventors: Yair Orbach, Hashomron; Heinrich Iosub, LeZion; Effi Orian, Saba, all of Israel

[73] Assignee: Motorola, Inc., Schaumburg, Ill.

[21] Appl. No.: 202,060

[22] Filed: Feb. 25, 1994

[51] Int. Cl.$^6$ .............................................. H03K 7/08
[52] U.S. Cl. ...................................... 375/238; 370/9; 332/109
[58] Field of Search .............. 375/22; 370/9; 307/234; 328/111; 329/312; 332/109

[56] References Cited

U.S. PATENT DOCUMENTS

| | | | |
|---|---|---|---|
| 3,510,780 | 5/1970 | Buehrle | 375/22 |
| 4,502,024 | 2/1985 | Nishikawa et al. | 375/22 |
| 4,550,307 | 10/1985 | Akashi et al. | 332/109 |
| 5,021,788 | 6/1991 | Ueki et al. | 341/152 |
| 5,070,312 | 12/1991 | Cho | 332/109 |
| 5,231,363 | 7/1993 | Sano et al. | 375/22 |
| 5,298,871 | 3/1994 | Shimohara | 332/109 |

*Primary Examiner*—Stephen Chin
*Assistant Examiner*—T. Ghebretinsae
*Attorney, Agent, or Firm*—Paul J. Polansky

[57] ABSTRACT

A pulse width modulator (PWM) (20) receives a two's complement input number and separates a sign bit from remaining less significant bits. The PWM converts these bits into an unsigned number in dependence on the sign bit. A comparator (41) provides a compare output signal in response to an output of a counter (30) equaling the unsigned number. An output circuit (25) provides first and second pulse width modulated signals for a length of time determined by the output of the comparator (41) in dependence on whether the sign bit indicates a positive or negative sign. In one embodiment, the PWM (20) converts a negative two's complement number to the unsigned number by one's complementing the least significant bits, and the output circuit (25) keeps the second pulse width modulated signal active for one additional clock cycle to fully convert to two's complement form, without the need for a carry operation.

13 Claims, 6 Drawing Sheets

TWO'S COMPLEMENT PULSE WIDTH MODULATOR AND METHOD FOR PULSE WIDTH MODULATING A TWO'S COMPLEMENT NUMBER

CROSS-REFERENCE TO RELATED APPLICATION

Related subject matter is contained in a patent application entitled "Reconfigurable Counter and Pulse Width Modulator Using Same", Attorney Docket No. SC-0287EI, Ser. No. 08/201,736, filed concurrently herewith and assigned to the assignee hereof.

FIELD OF THE INVENTION

This invention relates generally to electrical circuits, and more particularly, to pulse width modulators.

BACKGROUND OF THE INVENTION

Pulse width modulators (PWMs) are useful for several applications, including communications, control applications such as motor controllers, and the like. A PWM receives an input value and provides an output pulse whose duty cycle is determined by the input value. A typical PWM includes a counter which counts the number of cycles of a clock signal, an input register for storing the input value, and a comparator which detects when the counter reaches the input value and switches the output signal.

Because of their control applications, PWMs are frequently combined with data processors in a single integrated circuit. The PWM would be connected to an internal bus of the data processor. Typically, the PWM would be a memory-mapped peripheral, and the data processor would write the input number to the PWM using the internal bus.

Some data processors, however, operate on two's complement data. The twos complement numbering system is able to represent both positive and negative numbers. In the two's complement numbering system, the most significant bit is the sign bit, which is a zero to represent a positive number and a one to represent a negative number. The two's complement numbering system is especially useful for control applications to represent signed quantities. However, known PWMs are designed to operate on unsigned input numbers and would require additional circuitry to convert from two's complement to unsigned format. This conversion operation increases circuit size. What is needed, then, is a PWM which can accept two's complement input data and therefore accept the data directly from the data processors bus without a large amount of added circuit area.

SUMMARY OF THE INVENTION

Accordingly, the present invention provides, in one form, a two's complement pulse width modulator comprising an input for receiving an input number, said input number being in two's complement notation and having a sign bit and a plurality of least significant bits, a converter, a counter, a comparator, and an output circuit. The converter has an input for receiving the input number, and an output for providing an unsigned number. The converter converts the least significant bits into the unsigned number in dependence on said sign bit. The counter has an input for receiving a clock input signal, and an output for providing a counter output signal. The comparator has a first input terminal for receiving the unsigned number, a second input for receiving the counter output signal, and an output for activating a compare output signal when the counter output signal equals the unsigned number. The output circuit has a first input for receiving the sign bit, a second input coupled to the output of the comparator, a first output for providing a first pulse width modulated signal if the sign bit indicates that the input number is positive, and a second output for providing a second pulse width modulated signal if the sign bit indicates that the input number is negative.

In another form, the present invention provides a method for pulse width modulating a two's complement number. An input number in two's complement notation having a sign bit and a plurality of least significant bits is received. The plurality of least significant bits are converted into an unsigned number in dependence on the sign bit. A counter is incremented in response to a clock signal and a counter output signal is provided at an output of the counter to indicate a state thereof. A latch is set in response to an activation of said counter output signal to provide a latched compare output signal. A first pulse width modulated signal is provided in a logic state indicated by the latched compare output signal when the sign bit indicates the input number is positive. A second pulse width modulated signal is provided in a logic state indicated by said latched compare output signal when said sign bit indicates said input number is negative.

These and other features and advantages will be more clearly understood from the following detailed description taken in conjunction with the accompanying drawings.

DETAILED DESCRIPTION OF A PREFERRED EMBODIMENT

Figure 1:
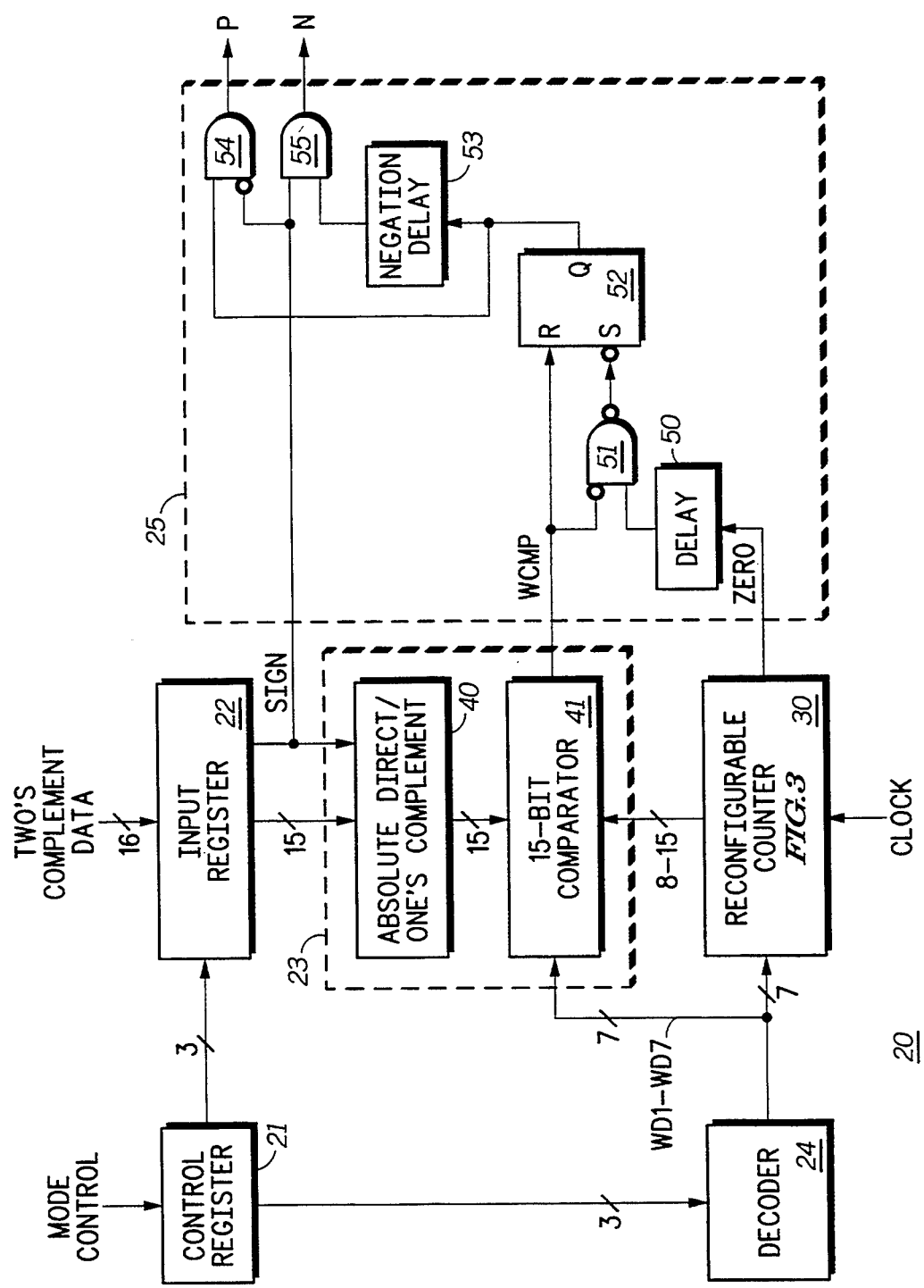
FIG. 1 illustrates in partial block diagram and partial logic diagram form a pulse width modulator (PWM) according to the present invention.

FIG. 1 illustrates in partial block diagram and partial logic diagram form a pulse width modulator (PWM) 20 according to the present invention. PWM 20 includes generally a control register 21, an input register 22, a comparator section 23, a decoder 24, an output circuit 25, and a reconfigurable counter 30. Mode control register 21 has an input for receiving a set of signals labelled "MODE CONTROL", a first output for providing three mode control signals to a control input of input register 22, and a second output for providing three other mode control signals to decoder 24. The three mode control signals provided to input register 22 are signals designated "R", "W", and "LD", for controlling the operation of input register 22. The three mode control signals provided to decoder 24 are signals designated "I-I", "M", and "L", representing the high or most-significant, the medium or next most-significant, and the low or least-significant bits of a 3-bit quantity which encodes a programmable size of counter 30. Mode control register 21 provides additional control signals, not shown, to control the operation of the various blocks of PWM 20, but their description is not important to understanding the present invention and thus they are omitted from the discussion.

Input register 22 has a data input for receiving a 16-bit input number labelled "TWO'S COMPLEMENT DATA", a control input for receiving the three mode control signals (R, W, and LD)) from control register 21, a first 15-bit output connected to comparator section 23, and a second 1-bit output connected to comparator section 23 for providing a signal labelled "SIGN". Input register 22 includes a register section and a latch section (not shown) which prevent the outputs from changing during use by comparator section 23. Signals R and W control the reading and writing of the register section, respectively. Signal LD controls the loading of the latch during a read of the counter section.

Comparator section 23 has a 15-bit input connected to the first output of input register 22, a first control input connected to the second output of input register 22 for receiving signal SIGN, a second control input for receiving seven control signals labelled "WD1-WD7" from decoder 24, and an output connected to an input of output circuit 25 for providing a signal labelled "WCMP". Comparator section 23 includes an absolute direct/one's complement block 40, and a 15-bit comparator 41. Block 40 has an input for receiving the 15-bit output from input register 22, a control input for receiving signal SIGN, and a 15-bit output. Block 40 selectively performs one's complementing (inversion) on the 15-bit input number based on the value of the SIGN bit. Block 40 is very efficient and quick because if the SIGN bit is negative (indicated by a binary 1), block 40 performs a one's complement operation on all of the bits in parallel in order to provide a quantity which represents the absolute value of TWO'S COMPLEMENT DATA minus one. If the SIGN bit is positive (indicated by a binary 0), block 40 passes the bits unaltered to the output. Note that block 40 does not convert a negative value number to its absolute value representation; rather, it finds the one's complement, which is a pulse width modulated signal labelled "N" for negative input numbers, and output circuit 25 later inserts an extra cycle into signal N to compensate for using the one's complement value. Thus, block 40 may be implemented simply, without an adder circuit having carry capability.

Comparator 41 is a 15-bit comparator whose width (number of bit positions compared) is controlled by signals WD1-WD7. Once comparator 41 is configured by signals WD1-WD7, if the selected bits of the input number equal the selected bits of the output of counter 30, then 15-bit comparator 41 activates signal WCMP.

Decoder 24 has an input for receiving the three control bits from control register 21 (H, M, and L), an output for providing signals WD1-WD7. Decoder 24 performs a binary-to-thermometer decoding of signals H, M, and L to provide signals WD1-WD7. For example, decoder 24 provides signal WD1 at a binary zero for all codes of HML besides 000; decoder 24 provides signal WD2 at a binary zero for all codes of HML besides 000 and 001; etc. The correspondence between H, M, and L and signals WD1-WD7 is shown in TABLE I below:

TABLE I

| H | M | L | WD7 | WD6 | WD5 | WD4 | WD3 | WD2 | WD1 |
|---|---|---|-----|-----|-----|-----|-----|-----|-----|
| 0 | 0 | 0 | 1   | 1   | 1   | 1   | 1   | 1   | 1   |
| 0 | 0 | 1 | 1   | 1   | 1   | 1   | 1   | 1   | 0   |
| 0 | 1 | 0 | 1   | 1   | 1   | 1   | 1   | 0   | 0   |
| 0 | 1 | 1 | 1   | 1   | 1   | 1   | 0   | 0   | 0   |
| 1 | 0 | 0 | 1   | 1   | 1   | 0   | 0   | 0   | 0   |
| 1 | 0 | 1 | 1   | 1   | 0   | 0   | 0   | 0   | 0   |
| 1 | 1 | 0 | 1   | 0   | 0   | 0   | 0   | 0   | 0   |
| 1 | 1 | 1 | 0   | 0   | 0   | 0   | 0   | 0   | 0   |

Reconfigurable counter 30 has a control input for receiving signals WD1-WD7, a clock input for receiving signal CLOCK, a parallel output for providing a count value whose width is reconfigurable from between 8 and 15 bits based on signals WD1-WD7, and an output for providing a signal labelled "ZERO" to an input of output circuit 25. Counter 30 provides signal ZERO when the outputs of selected ones of a set of fifteen counter cells are all zero, i.e., counter 30 has reached a terminal count and "rolled over".

Output circuit 25 has a first input for receiving signal SIGN, a second input for receiving signal WCMP, a third input for receiving signal ZERO, and first and second outputs for providing signals labelled "P" and "N", respectively. FIG. 1 illustrates a functional embodiment of output circuit 25 whose actual implementation will vary from embodiment to embodiment. In this functional embodiment, output circuit 25 includes a delay element 50, a NAND gate 51, a latch 52, a negation delay element 53, and AND gates 54 and 55. Delay element 50 has an input terminal for receiving signal ZERO, and an output terminal. NAND gate 51 has a complementary input terminal for receiving signal WCMP, a true input terminal connected to the output terminal of delay element 50, and an output terminal. Latch 52 has an active low set or "S" input terminal connected to the output terminal of NAND gate 51, an active high reset or "R" input terminal for receiving signal WCMP, and an output terminal labelled "Q" for providing an output signal thereof. Negation delay element 53 has an input terminal connected to the Q output terminal of latch 52, and an output terminal. AND gate 54 has a true input terminal connected to the Q output terminal of latch 52, a complementary input terminal connected to the second output terminal of input register 22 for receiving the SIGN bit, and an output terminal for providing signal P. AND gate 55 has a first input terminal connected to the second output terminal of input register 22 for receiving the SIGN bit, a second input terminal connected to the second output terminal of negation delay element 53, and an output terminal for providing signal N.

PWM 20 is a pulse width modulator which is responsive to set the pulse width of an output signal by receiving an input number (TWO'S COMPLEMENT DATA) in twos complement form. Thus, PWM 20 is suited to be directly connected to a data processing system bus. In particular, a class of data processors known as digital signal processors (DSPs) have arithmetic hardware to process data in two's complement form. Thus, PWM 20 is able to accept two's complement data directly, without an intermediate conversion step.

In particular, certain DSPs operate on fractional two's complement data, which has a value between 0 and 1, in which the most significant bit is the sign bit and less-significant bits correspond to a fractional power of two. One DSP, the 56000 DSP available from Motorola, Inc., has a 24-bit internal bus structure. Thus, PWM 20 may be connected to the 24-bit internal data bus by connecting input register 22 to the sixteen most-significant data bus lines. Thus, using fractional two's complement arithmetic, only the least significant fractional bits are not used by PWM 20.

PWM 20 also operates with reduced power from known PWMs by including reconfigurable counter 30, whose width is determined by bits in a control word. Counter 30 is able to disable the unused counter cells and thus to save power. For example, over a programmable range of from eight to fifteen bits, counter 30 counter will have an overall cycle as shown in TABLE II below:

TABLE II

| H | M | L | COUNTER WIDTH | PWM 20 CYCLE |
|---|---|---|---|---|
| 0 | 0 | 0 | 15 BITS | 32768 CLOCK CYCLES |
| 0 | 0 | 1 | 14 BITS | 16384 CLOCK CYCLES |
| 0 | 1 | 0 | 13 BITS | 8192 CLOCK CYCLES |
| 0 | 1 | 1 | 12 BITS | 4096 CLOCK CYCLES |
| 1 | 0 | 0 | 11 BITS | 2048 CLOCK CYCLES |
| 1 | 0 | 1 | 10 BITS | 1024 CLOCK CYCLES |
| 1 | 1 | 0 | 9 BITS | 512 CLOCK CYCLES |
| 1 | 1 | 1 | 8 BITS | 256 CLOCK CYCLES |

Comparator 41 also saves power by only comparing the input number to the output of counter 30 for those significant bit positions defined by signals WD1–WD7.

In comparator section 23, block 40 is also implemented efficiently, without the need for adder circuitry with carry capability. Thus, block 40 may be implemented with fifteen inverters and inverters and fifteen 2-to-1 multiplexers. In order to allow this simplification, output circuit 25 includes logic to insert an additional period during which signal N is active when the input number is a negative number.

Output circuit 25 provides two signals, N and P, which represent negative and positive pulse width modulated signals. These signals are useful, for example, for motor controllers in which separate signals control positive and negative displacements. Signal WCMP resets latch 52, which results in either signal P or signal N becoming active based of the value of signal SIGN. Delay element 50 prevents a race condition in which latch 52 simultaneously receives both set and reset pulses. Negation delay element 53 delays by one CLOCK cycle only the inactivation of its output, which occurs when its input transitions from an active to an inactive logic state. Thus, negation delay element 53 acts to inject an additional clock period during which signal N is active at a logic high, to compensate for block 40 performing a one's complement operation on a negative two's complement number.

Figure 2:
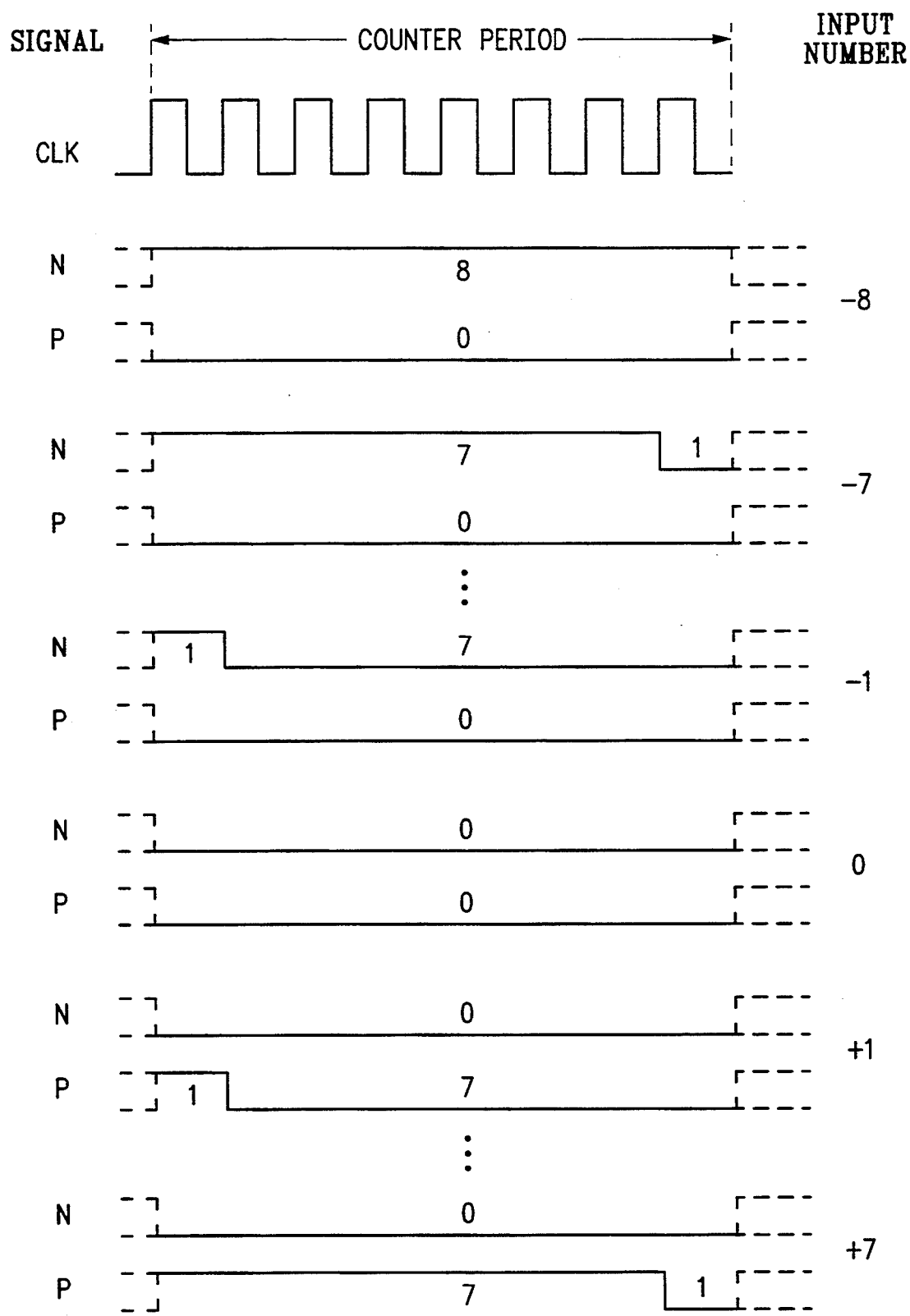
FIG. 2 illustrates a timing diagram of signals of the pulse width modulator of FIG. 1 useful in understanding the present invention.

FIG. 2 illustrates a timing diagram of signals of pulse width modulator 20 of FIG. 1 useful in understanding the present invention. FIG. 2 illustrates the case of 4-bit TWO'S COMPLEMENT DATA, which is useful in understanding the operation of PWM 20 using 16-bit TWO'S COMPLEMENT DATA. In the two's complement number system, four bits are able to represent numbers from $-8$ to $+7$. Signal N is a pulse width modulated output signal for a negative input number. For a four bit input number, the PWM has a period of eight ($2^{(4-1)}$) clock cycles. When TWO'S COMPLEMENT DATA has a value of $-8$, signal N is provided at a logic high voltage for the entire period. For negative values, signal P is inactive at a logic low. When TWO's COMPLEMENT DATA is equal to $-7$, signal N is active for seven of the eight cycles of the period, and is inactive at a logic low for one cycle. This pattern repeats until, for an input number of $-1$, signal N is active for one clock cycle and inactive for seven clock cycles.

TWO'S COMPLEMENT DATA equal to zero is a special case, in which both signals N and P are inactive at a logic low. For positive values of TWO'S COMPLEMENT DATA, signal N is inactive at a logic low. For a value of TWO'S COMPLEMENT DATA of $+1$, signal P is active for one clock cycle, and inactive for seven clock cycles. When TWO'S COMPLEMENT DATA is equal to $+2$, signal P is active for two cycles and inactive for six cycles. This pattern continues until, when TWO'S COMPLEMENT DATA is equal to $+7$, signal P is active for seven clock cycles and inactive for one clock cycle. $+7$ is the largest positive number in the 4-bit two's complement numbering system.

This system has several advantages. First, PWM 20 is able to accept data directly from a data processor bus which conducts two's complement data. Second, signals P and N are available outputs to provide, for example, positive and negative displacements for motors or the like, and at the same time able to provide duty cycles from 0 to 100%.

Figure 3:
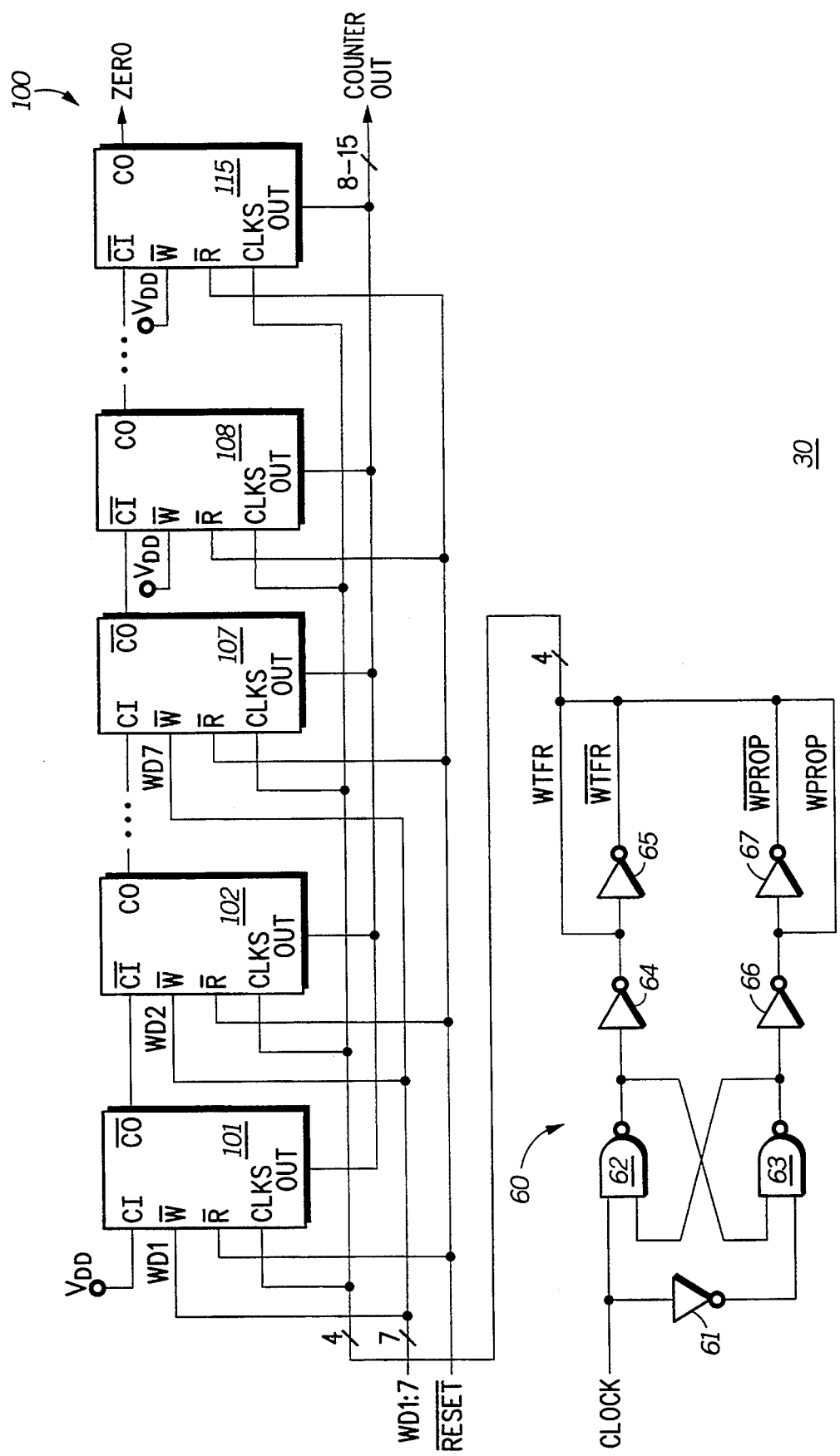
FIG. 3 illustrates in partial block diagram and partial logic diagram form the reconfigurable counter of FIG. 1.

FIG. 3 illustrates in partial block diagram and partial logic diagram form reconfigurable counter 30 of FIG. 1. Counter 30 includes generally a clock portion 60, and a counter portion 100. Clock portion 60 includes an inverter 61, NAND gates 62 and 63, and inverters 64–67. Inverter 61 has an input terminal for receiving signal CLOCK, and an output terminal. NAND gate 62 has a first terminal for receiving signal CLOCK, a second terminal, and an output terminal. NAND gate 63 has a first terminal connected to the output terminal of NAND gate 62, a second terminal connected to the output terminal of inverter 61, and an output terminal connected to the second input terminal of NAND gate 62. Inverter 64 has an input terminal connected to the output terminal of NAND gate 62, and an output terminal for providing a clock signal labelled "WTFR". Inverter 65 has an input terminal connected to the output terminal of inverter 64, and an output terminal for providing a clock signal labelled "WTFR" Inverter 66 has an input terminal connected to the output terminal of NAND gate 63, and an output terminal for providing a clock signal labelled "WPROP". Inverter 67 has an input terminal connected to the output terminal of inverter 66, and an output terminal for providing a clock signal labelled "WPROP".

Clock portion 60 receives signal CLOCK and latches it in a latch formed by cross-coupled NAND gates 62 and 63. The outputs of NAND gates 62 and 63 are then inverted once to form a true transfer signal WTFR and a true propagate signal WPROP. These signals are then each inverted to form a complementary transfer signal WTFR and a complementary propagate signal WPROP, respectively. Together, these four signals form clock signals for the operation of counter portion 100.

Counter portion 100 includes fifteen counter cells 101–115, including counter cells 101, 102, 107, 108, and 115 illustrated in FIG. 3. Other counter cells are omitted but the illustrated counter cells are sufficient to illustrate the structure of the omitted counter cells. Each counter cell has a carry input terminal, a width input terminal labelled "W", a reset input terminal labelled "R" for receiving a reset input signal labelled "RESET", four clock input terminals labelled "CLKS" and connected to the rotor outputs of clock portion 60, an output terminal labelled "OUT", and a carry out terminal. The carry input and output terminals for a given counter cell have opposite polarities, i.e., one is true and the other is complementary. Adjacent counter cells have opposite polarities as well. A first type of counter cell corresponding to the odd-order counter cells such as counter cells 101, 107, and 115, has a true carry input terminal labelled "CI" and a complementary carry output terminal labelled "CO". A second type of counter cell corresponding to the even-order counter cells such as counter cells 102 and 108, has a complementary carry input terminal labelled "CI" and a true carry output terminal labelled "CO".

Counter cell 101 is a least-significant counter cell and has a CI input terminal connected to a power supply voltage terminal labelled "$V_{DD}$", and a W input for receiving signal WD1. $V_{DD}$ is a more-positive power supply voltage terminal representative of an active-high logic level. Counter cell 102 has a CI input terminal connected to the CO output terminal of counter cell 101, and a W input terminal for receiving signal WD2. Counter cells 103–107 are connected together in this same way, with each counter cell receiving a corresponding one of decoded width signals WD1–WD7. Counter cells 108–115, however, have W input terminals which are connected to $V_{DD}$. Thus, signals WD1–WD7 selectively enable selected counter cells, while counter cells 108–115 are always active. Together, the output terminals of counter cells 101–115 form signal COUNTER OUTPUT, which will have a variable number of valid bits from 8–15 as determined by signals WD1–WD7.

Figure 4:
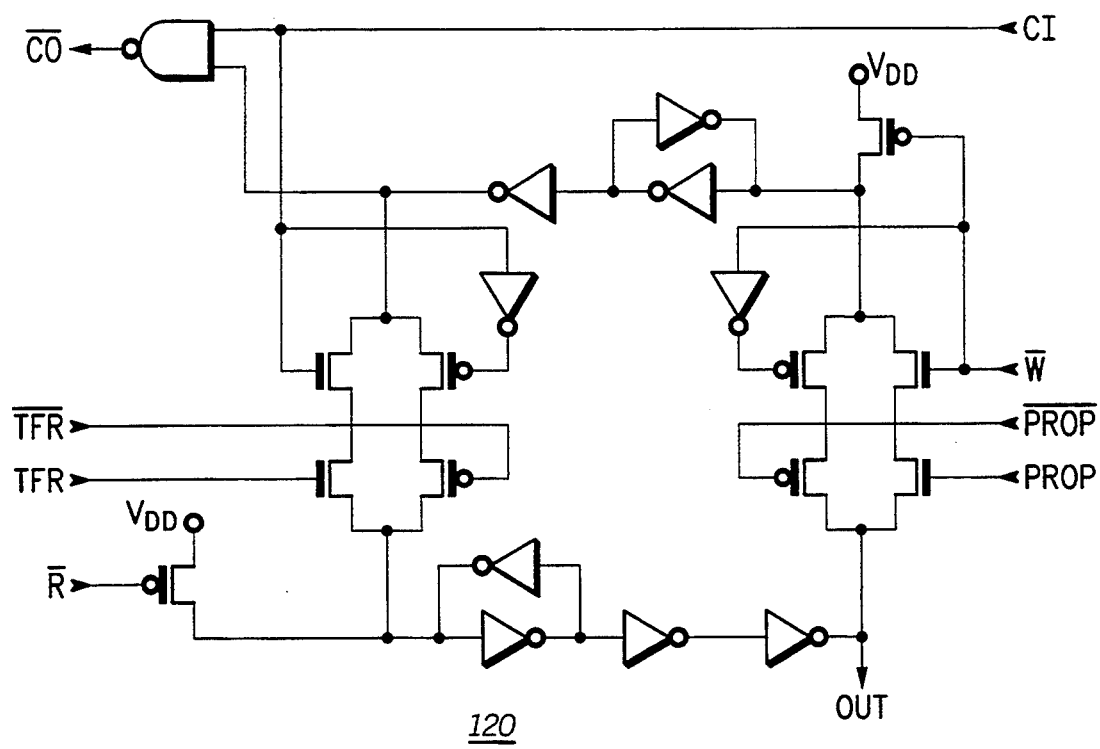
FIG. 4 illustrates in partial logic diagram and partial schematic form a first counter cell used in the counter of FIG. 3.

FIG. 4 illustrates in partial logic diagram and partial schematic form a first counter cell 120 used in counter 30 of FIG. 3. Counter cell 120 corresponds to each of the odd-order counter cells of counter 30. Counter cell 120 is implemented with a master/slave latch structure. Counter cell 120 is implemented using complementary metal-oxide-semiconductor (CMOS) transistors and logic gates. It should be apparent, however, counter cell 120 may be implemented with other available technologies and with other logic designs.

Figure 5:
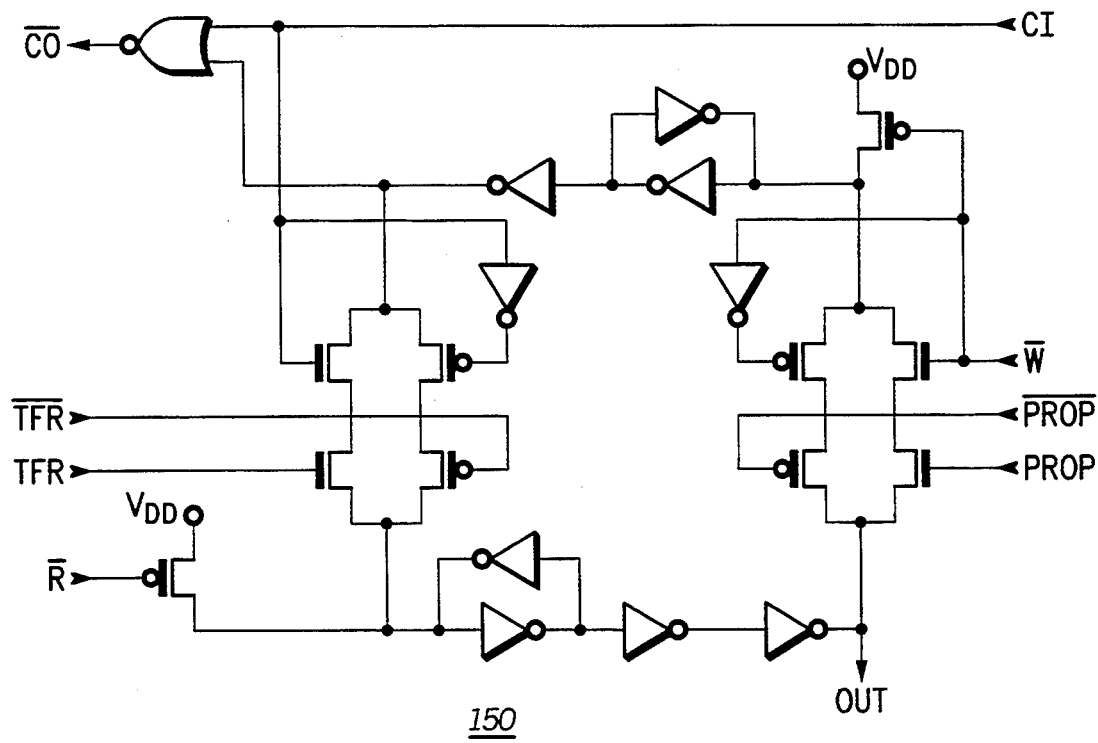
FIG. 5 illustrates in partial logic diagram and partial schematic form a second counter cell used in the counter of FIG. 3.

FIG. 5 illustrates in partial logic diagram and partial schematic form a second counter cell 150 used in counter 30 of FIG. 3. Counter cell 150 corresponds to each of the even-order counter cells of counter 30. Counter cell 150 is implemented with a master/slave latch structure. Counter cell 150 is implemented using CMOS transistors and logic gates. It should be apparent, however, counter cell 150 may be implemented with other available technologies and with other logic designs.

Figure 6:
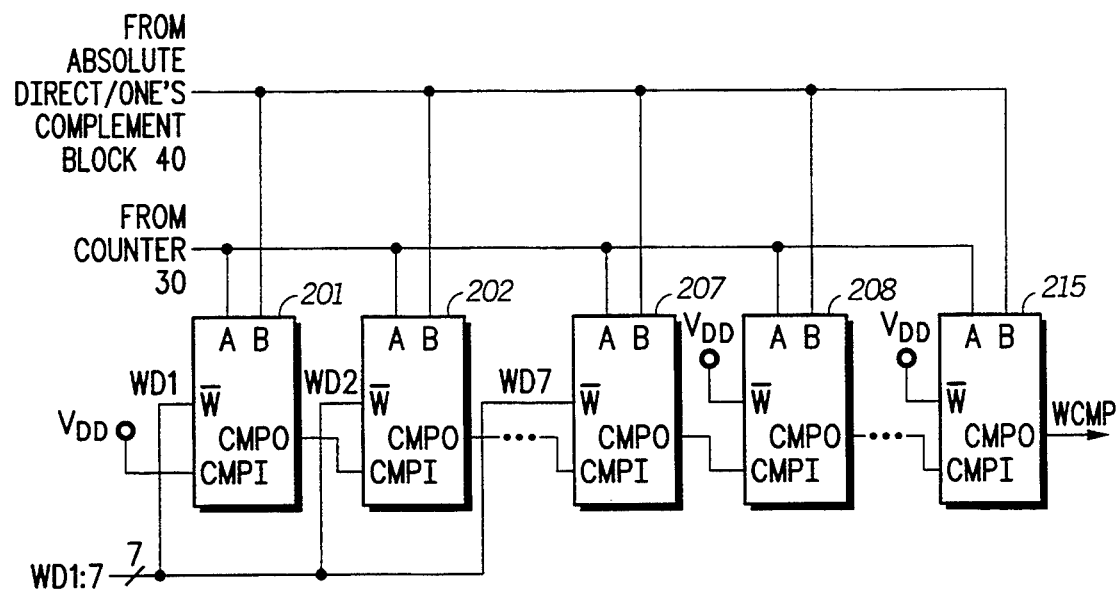
FIG. 6 illustrates in partial block diagram and partial logic diagram form the comparator of FIG. 1.

FIG. 6 illustrates in partial block diagram and partial logic diagram form comparator 41 of FIG. 1. Comparator 41 includes fifteen comparator cells 201–215, including comparator cells 201, 202, 207, 208, and 215 illustrated in FIG. 6. Other comparator cells are omitted but the illustrated counter cells are sufficient to illustrate the structure of the omitted comparator cells. Each comparator cell has a first or "A" input terminal for receiving a corresponding bit of the output of counter 30, a second or "B" input terminal receiving a corresponding bit of absolute direct/one's complement block 40, a W input terminal, a compare input terminal labelled "CMPI", and a compare output terminal labelled "CMPO". Comparator cells 201–207 each have a W input terminal for receiving a corresponding one of signals WD1–WD7. Comparator cells 208–215 each have a W input terminal connected to $V_{DD}$. Comparator cell 201 has a CMPI input terminal connected to $V_{DD}$. Each comparator cell besides comparator cell 201 has CMPI input terminal connected to a CMPO output terminal of next less-significant comparator cell. Comparator cell 215, the most-significant comparator cell, has a CMIO output terminal which provides signal WCMP, which is the output of comparator 41.

Figure 7:
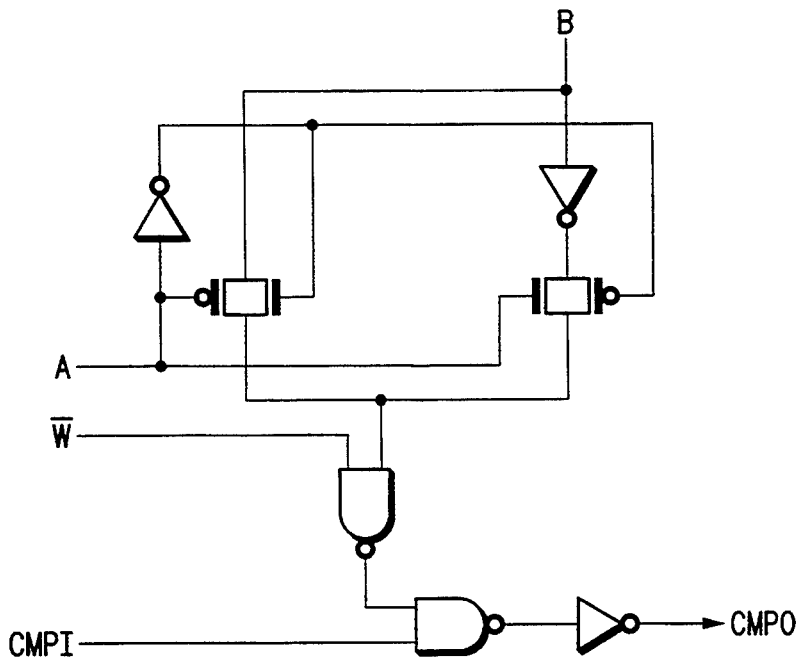
FIG. 7 illustrates in partial logic diagram and partial schematic form a comparator cell used in the comparator of FIG. 6.

FIG. 7 illustrates in partial logic diagram and partial schematic form comparator cell 201 used in comparator 41 of FIG. 6. Note that each comparator cell in comparator 41 is structurally identical to comparator cell 201. Comparator cell 201 is implemented using CMOS transistors and logic gates. It should be apparent, however, that comparator cell 201 may be implemented with other available technologies and with other logic designs.

Figure 8:
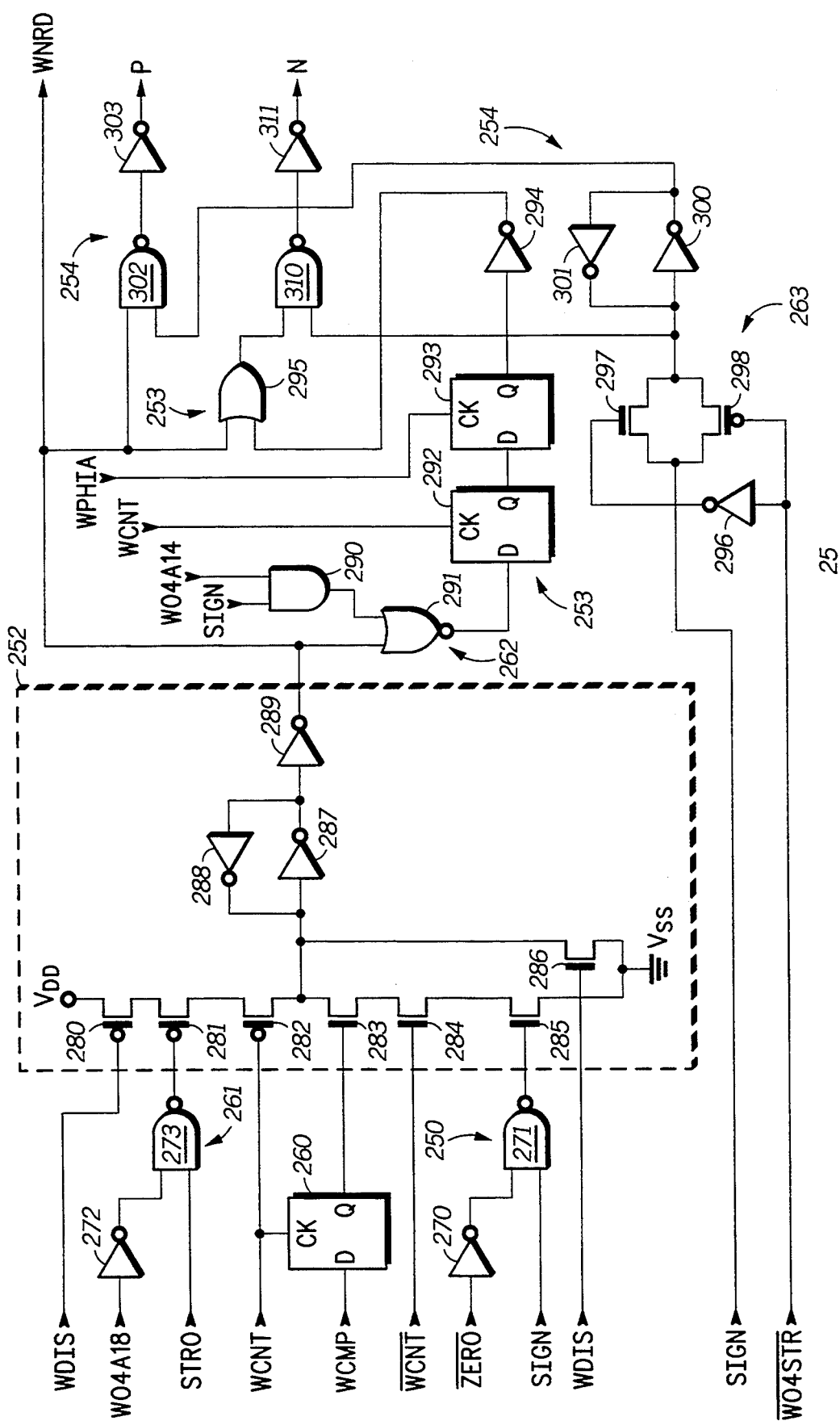
FIG. 8 illustrates in partial logic diagram and partial schematic form a preferred embodiment 250 of output circuit 25 of FIG. 1.

FIG. 8 illustrates in partial logic diagram and partial schematic form a preferred embodiment of output circuit 25 of FIG. 1. Output circuit 25 includes generally a delay portion 250, a latch 252, a negation delay portion 253, an AND logic circuits 254 and 255, a D type flip flop 260, correction circuits 261 and 262, and a synchronizer 263. Additional signals besides those previously described as received as inputs to FIG. 8, and their functions are described in TABLE III below:

TABLE III

| SIGNAL NAME | DESCRIPTION |
| --- | --- |
| W04A18 | A sample of signal WCMP used to avoid setting latch 252 if it was equal to counter 30 when the value of counter 30 is zero |
| STRO | A start signal which sets latch 252 when counter 30 starts |
| W04STR | Complement of signal STRO |
| WCNT | Clock signal of counter 30 |
| WCNT | Complement of signal WCNT |
| WPHIA | Pulse width modulator 20 clock signal, which connects signal PROP to the input of cells in counter 30 |
| W04A14 | A pre-start signal indicating a clock cycle should start |
| WDIS | Disable signal which causes reset of internal |

TABLE III-continued

| SIGNAL NAME | DESCRIPTION |
|---|---|
| | state |

Delay portion 250 includes an inverter 270 and a NAND gate 271. Inverter 270 has an input terminal for receiving an active low version of signal ZERO labelled "ZERO", and an output terminal. NAND gate 271 has a first input terminal connected to the output terminal of inverter 270, a second input terminal for receiving signal SIGN, and an output terminal. Inverter 270 and NAND gate 271 together provide a delay and portion 250 serves to prevent spikes when a negative input number follows a 100% duty cycle input number. Flip flop 260 has a D input terminal for receiving signal WCMP a CK input terminal for receiving signal WCNT, and a Q output terminal.

Correction circuit 261 includes an inverter 272 and a NAND gate 273. Inverter 272 has an input terminal for receiving signal W04A18, and an output terminal. NAND gate 273 has a first input terminal connected to the output terminal of inverter 272, a second input terminal for receiving signal STRO, and an output terminal. Correction circuit 261 operates to prevent spikes when the input number is zero.

Latch 252 has three active-low set input terminals, three active-high reset input terminals, a latch reset input terminal, and an output terminal, and includes P-channel transistors 280–282, N-channel transistors 283–286, and inverters 287–289. Transistor 280 has a source connected to $V_{DD}$, a gate for receiving signal WDIS and forming the first set input terminal, and a drain. Transistor 281 has a source connected to the drain of transistor 280, a gate connected to the output terminal of NAND gate 273 and forming the second set input terminal, and a drain. Transistor 282 has a source connected to the drain of transistor 281, a gate for receiving signal WCNT and forming the third set input terminal, and a drain. Transistor 283 has a drain connected to the drain of transistor 282, a gate connected to the Q output terminal of flip flop 200 and forming the first reset input terminal, and a source. Transistor 284 has a drain connected to the source of transistor 283, a gate for receiving signal WCNT and forming the second reset input terminal, and a source. Transistor 285 has a drain connected to the source of transistor 284, a gate, connected to the output terminal of NAND gate 271 and forming the third reset input terminal, and a source connected to a power supply voltage terminal labelled "$V_{SS}$". $V_{SS}$ is a more-negative power supply voltage terminal having a nominal voltage of approximately zero volts. Transistor 286 has a drain connected to the drain of transistor 282, a gate for receiving signal WDIS and forming the latch reset input terminal, and a source connected to $V_{SS}$. Inverter 287 has an input terminal connected to the drain of transistor 282, and an output terminal. Inverter 288 has an input terminal connected to the output terminal of inverter 287, and an output terminal connected to the input terminal of inverter 287. Inverter 289 has an input terminal connected to the output terminal of inverter 287, and an output terminal forming the output terminal of latch 252 and providing an output signal labelled "WNRD". Latch 252 latches a logic high voltage or "1" and provides its output at a logic high in response to all three voltages at the set input terminals being active at a logic low. Latch 252 latches a logic low voltage or "0" provides its output at a logic low in response to all three voltages at the reset input terminals being active at a logic high. Signals WCNT and WCNT ensure that latch 252 is not both setting and resetting at the same time.

Correction circuit 262 includes an AND gate 290 and a NOR gate 291. AND gate 290 has a first input terminal for receiving signal SIGN, a second input terminal for receiving signal W04A14, and an output terminal. NOR gate 291 has an input terminal connected to the output terminal of AND gate 290, a second input terminal connected to the output terminal of latch 252, and an output terminal. Correction circuit 262 operates to inject one cycle when the input number is equal to FFFF hexadecimal ($FFFF).

Negation delay portion 253 includes D type flip flops 292 and 293, an inverter 294, and an OR gate 295. Flip flop 292 has a D input terminal connected to the output terminal of NOR gate 291 a CK input terminal for receiving signal WCNT, and a Q output terminal. Flip flop 293 has a D input terminal connected to the Q output terminal of flip flop 292, a CK input terminal for receiving signal WPHIA, and a Q output terminal. Inverter 294 has an input terminal connected to the, output terminal of flip flop 293, and an output terminal. OR gate 295 has a first input terminal connected to the output terminal of inverter 294, a second input terminal connected to the Q output terminal of latch 252, and an output terminal. Negation delay portion 253 provides no delay on the activation of signal N but a one CLOCK cycle delay on the inactivation of signal N.

Synchronizer 263 includes an inverter 296, an N-channel transistor 297, and a P-channel 298. Inverter 296 has an input terminal for receiving signal W04STR, and an output terminal. Transistor 297 has a first source/drain terminal for receiving signal SIGN, a gate connected to the output terminal of inverter 296, and a second source/drain terminal. Transistor 298 has a first source/drain terminal for receiving signal SIGN, a gate for receiving signal W04STR, and a second source/drain terminal connected to the second source/drain terminal of transistor 297. Transistors 297 and 298 collectively form a transmission gate and the designation of which terminal is the source and which is the drain depends of the voltages applied. Synchronizer 263 serves to update signal SIGN to AND logic circuits 254 and 255 only on the activation of signal W04STR.

AND logic circuit 254 includes inverters 300 and 301, a NAND gate 310, and an inverter 311. Inverter 300 has an input terminal connected to the second source/drain terminals of transistors 297 and 298, and an output terminal. Inverter 301 has an input terminal connected to the output terminal of inverter 300, and an output terminal connected to the input terminal of inverter 300. NAND gate 302 has a first input terminal connected to the Q output terminal of latch 252, a second input terminal connected to the output terminal of inverter 301, and an output terminal. Inverter 303 has an input terminal connected to tile output terminal of NAND gate 302, and an output terminal for providing signal P. Together, inverters 300 and 301, NAND gate 302, and inverter 303 function as a latching AND gate with a true first input and a complementary second input.

AND logic circuit 255 includes a NAND gate 310, and an inverter 311. NAND gate 310 has a first input terminal connected to the output terminal of OR gate 295, a second input terminal connected to the second source/drain input terminals of transistors 297 and 298, and an output terminal. Inverter 303 has an input terminal connected to tile output terminal of NAND gate 310, and an output terminal for providing signal N. Together, NAND gate 310 and inverter 311 function as an AND gate with two true inputs.

It should be apparent that output circuit 25 illustrated in FIG. 8 is just one possible output circuit which may be used in PWM 20 of FIG. 1. However, it should be noted that any output circuit preferably has the corrections provided by correction circuits 261 and 262. Furthermore, while it is possible to include a full two's complement to absolute value converter circuit, it is preferable to perform one's complementing and provide an added cycle delay to signal N as provided by negation delay portion 253.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A two's complement pulse width modulator comprising:
   an input for receiving an input number, said input number being in two's complement notation and having a sign bit and a plurality of least significant bits;
   a converter having an input for receiving said input number, and an output for providing an unsigned number, said converter converting said plurality of least significant bits into said unsigned number in dependence on said sign bit;
   a counter having an input for receiving a clock input signal, and an output for providing a counter output signal;
   a comparator having a first input for receiving said unsigned number, a second input for receiving said counter output signal, and an output for activating a compare output signal when said counter output signal equals said unsigned number; and
   an output circuit having a first input for receiving said sign bit, a second input coupled to said output of said comparator, a first output for providing a first pulse width modulated signal when said sign bit indicates that said input number is positive, and a second output for providing a second pulse width modulated signal when said sign bit indicates that said input number is negative.

2. The pulse width modulator of claim 1 wherein said output circuit comprises:
   a latch having a set input, a reset input coupled to said output of said comparator, and an output;
   said counter providing a second output thereof in response to counting a predetermined number of cycles of said clock input signal, said predetermined number of cycles forming a period of said pulse width modulator;
   a first logic circuit having a first complementary input coupled to said output of said comparator, a second true input coupled to said second output of said counter, and an output coupled to said set input of said latch, said first logic circuit activating said output thereof when both said first complementary input is inactive and said second true input is active;
   a second logic circuit having a first input for receiving said sign bit, a second input coupled to said output of said latch, and an output for providing said second pulse width modulated signal; and
   a third logic circuit having a first input for receiving said sign bit, a second input coupled to said output of said latch, and an output for providing said first pulse width modulated signal.

3. A two's complement pulse width modulator comprising:
   an input for receiving an input number, said input number being in two's complement notation and having a sign bit and a plurality of least significant bits;
   a converter having an input for receiving said input number, and an output for providing an unsigned number;
   said converter converting said input number to said unsigned number by providing said plurality of least significant bits as said unsigned number when said sign bit indicates said input number is positive;
   said converter converting said input number to said unsigned number by inverting each of said plurality of least significant bits to form said unsigned number when said sign bit indicates said input number is negative;
   a counter having an input for receiving a clock input signal, and an output for providing a counter output signal; a comparator having a first input for receiving said unsigned number, a second input for receiving said counter output signal, and an output for activating a compare output signal when said counter output signal equals said unsigned number; and
   an output circuit having an input coupled to said output of said comparator, and an output for providing a first pulse width modulated signal in response thereto.

4. The pulse width modulator of claim 3 wherein said output circuit includes delay means for activating said first pulse width modulated signal for one extra cycle more than a number of cycles of said clock input signal during a period of said pulse width modulator indicated by said compare output signal, when said sign bit indicates said input number is negative.

5. The pulse width modulator of claim 3 wherein said output circuit provides said first pulse width modulated signal in an active state thereof for a first variable amount of time as determined by said unsigned number when said sign bit is in a first logic state, and wherein said output circuit further provides a second pulse width modulated signal in an active state thereof for a second variable amount of time as determined by said unsigned number when said sign bit is in a second logic state.

6. The pulse width modulator of claim 5 wherein said output circuit further provides both said first and second pulse width modulated signals in an inactive state in response to said input number being equal to zero.

7. The pulse width modulator of claim 5 wherein said output circuit comprises:
   a latch having a set input, a reset input coupled to said output of said comparator, and an output;
   said counter providing a second output thereof in response to counting a predetermined number of cycles of said clock input signal, said predetermined number of cycles forming a period of the pulse width modulator;

a first logic circuit having a first complementary input coupled to said output of said comparator, a second true input coupled to said second output of said counter, and an output coupled to said set input of said latch, said first logic circuit activating said output thereof when both said first input is inactive and said second input is active;

a second logic circuit having a first input for receiving said sign bit, a second input coupled to said output of said latch, and an output for providing said second pulse width modulated signal; and a third logic circuit having a first input for receiving said sign bit, a second input coupled to said output of said latch, and an output for providing said first pulse width modulated signal.

8. The pulse width modulator of claim 7 wherein said first logic circuit includes delay means for delaying an inactivation of said second output of said counter for one extra cycle of said clock input signal.

9. A method for pulse width modulating a two's complement number, comprising the steps of:

receiving an input number, said input number being in two's complement notation and having a sign bit and a plurality of least significant bits;

converting said plurality of least significant bits into an unsigned number in dependence on said sign bit;

incrementing a counter in response to a clock input signal and providing a counter output signal at an output of said counter to indicate a state thereof;

activating a compare output signal when said counter output signal equals said unsigned number;

setting a latch in response to an activation of said compare output signal to provide a latched compare output signal;

providing a first pulse width modulated signal in a logic state indicated by said latched compare output signal when said sign bit indicates said input number is positive; and providing a second pulse width modulated signal in a logic state indicated by said latched compare output signal when said sign bit indicates said input number is negative.

10. The method of claim 9 further comprising the step of resetting said latch in response to said counter activating a start signal when said counter output signal is inactive.

11. A method for pulse width modulating a two's complement number, comprising the steps of:

receiving an input number, said input number being in two's complement notation and having a sign bit and a plurality of least significant bits;

converting said plurality of least significant bits into an unsigned number by providing said plurality of least significant bits as said unsigned number when said sign bit indicates said input number is positive;

converting said plurality of least significant bits into said unsigned number by inverting said plurality of least significant bits to provide as said unsigned number when said sign bit indicates said input number is negative;

incrementing a counter in response to a clock input signal and providing a counter output signal at an output of said counter to indicate a state thereof;

comparing said counter output signal to said unsigned number and providing a compare output signal in response to said counter output signal equaling said unsigned number;

setting a latch in response to an activation of said compare output signal to provide a latched compare output signal;

providing a first pulse width modulated signal in a logic state indicated by said latched compare output signal when said sign bit indicates said input number is positive; and providing a second pulse width modulated signal in a logic state indicated by said latched compare output signal when said sign bit indicates said input number is negative.

12. The method of claim 11 further comprising the step of resetting said latch in response to said counter activating a start signal when said counter output signal is inactive.

13. The method of claim 12 wherein said step of providing said second pulse width modulated signal comprises the step of keeping said second pulse width modulated signal in an active logic state for one additional cycle of said clock input signal more than indicated by said latched compare output signal when said sign bit indicates said input number is negative.

* * * * *